(12) United States Patent
McElvain et al.

(10) Patent No.: US 8,015,520 B2
(45) Date of Patent: *Sep. 6, 2011

(54) METHODS AND APPARATUSES FOR AUTOMATED CIRCUIT OPTIMIZATION AND VERIFICATION

(75) Inventors: Kenneth S. McElvain, Los Altos, CA (US); Vijay Seshadri, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 545 days.

This patent is subject to a terminal disclaimer.

(21) Appl. No.: 12/122,609

(22) Filed: May 16, 2008

(65) Prior Publication Data

US 2008/0216032 A1    Sep. 4, 2008

Related U.S. Application Data

(62) Division of application No. 11/124,496, filed on May 4, 2005, now Pat. No. 7,376,919.

(51) Int. Cl.
G06F 17/50 (2006.01)
(52) U.S. Cl. ........................................ 716/107; 716/106
(58) Field of Classification Search .................. 716/106, 716/107, 103, 132
See application file for complete search history.

(56) References Cited

U.S. PATENT DOCUMENTS

| | | | |
|---|---|---|---|
| 5,436,849 A * | 7/1995 | Drumm ........................ 716/106 |
| 6,026,222 A | 2/2000 | Gupta et al. | |
| 6,668,362 B1 | 12/2003 | McIlwain et al. | |
| 6,912,700 B1 | 6/2005 | Franco et al. | |
| 7,131,078 B1 | 10/2006 | Maheshwari et al. | |

* cited by examiner

*Primary Examiner* — Vuthe Siek
(74) *Attorney, Agent, or Firm* — Blakely, Sokoloff, Taylor & Zafman, LLP; Judith A. Szepesi

(57) ABSTRACT

Methods and apparatuses to automatically determine conditions at hierarchical boundaries of a hierarchical circuit design and to use the determined conditions in hierarchical optimization and verification. In one embodiment, a hierarchical block is optimized and transformed during design synthesis using one or more lemmas at the boundary of the hierarchical block. For example, the lemmas are automatically generated to specify range information for input boundary nodes. The lemmas are also used for the equivalence checker to perform hierarchical equivalence checking. Equivalence of hierarchical blocks is individually checked, in view of the lemmas. Thus, based on the lemmas, optimizations across hierarchical boundaries can be performed, while the hierarchical structure of the design is preserved so that equivalence checking of hierarchical circuit designs can still be based on the equivalence of individual hierarchical blocks.

22 Claims, 6 Drawing Sheets

METHODS AND APPARATUSES FOR AUTOMATED CIRCUIT OPTIMIZATION AND VERIFICATION

This present application is a divisional of U.S. patent application Ser. No. 11/124,496, filed on May 4, 2005 now U.S. Pat. No. 7,376,919.

FIELD OF THE TECHNOLOGY

The invention relates to automated circuit design, and more particularly to the automated optimization and verification of a design of a circuit.

BACKGROUND

For the design of digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

After the synthesis transformation, equivalence checking can be performed to verify that the resulting design is equivalent to the original design. There are a number of techniques known in the art for equivalence checking, including functional approaches, automatic test pattern generation (ATPG) based approaches and incremental approaches. A functional approach uses Binary Decision Diagrams (BDD) to compare the circuit designs. When the Binary Decision Diagrams of two designs are isomorphic, the two designs are equivalent. An ATPG based approach proves the equivalence of two designs by proving that the stuck-at-0 is a redundant fault for their miter output. A variation of an ATPG based approach is the Boolean Satisfiability (SAT) technique. An incremental approach is based on reducing the miter circuit through the identification of internal equivalent pairs of the circuit nodes.

A hierarchical design approach breaks a large circuit into hierarchical blocks. Typically, each of the hierarchical blocks is individually synthesized for optimization and for design layout. Since the hierarchical boundaries isolate the hierarchical blocks from each other, the design of each of the hierarchical blocks can be individually verified. Since the hierarchical boundaries break a large problem into a series of smaller problems, the optimization and verification of the design can be efficiently performed at smaller scales. For a hierarchical design, synthesis transformation and optimization are typically limited within the hierarchical blocks. When no optimization is performed across the hierarchical boundaries, the verification can be performed based on the equivalence of the individual hierarchical blocks. When each of the hierarchical blocks is equivalent, the synthesized circuit design is equivalent to the original circuit design.

Alternatively, a hierarchical design can be flattened so that the entire circuit is optimized and verified as one unit. However, the computation resources typically limit the size of the entire circuit that can be optimized and verified as one flattened unit.

In certain situations, a designer may observe opportunities for optimization across the hierarchical boundary and manually optimize the design across the hierarchical boundary. To use a hierarchical approach in verifying the equivalence, the designer then manually prescribes user assertions for the equivalence checking programs to prevent the false result of non-equivalence when the equivalence of the hierarchical blocks is checked individually.

SUMMARY OF THE DESCRIPTION

Methods and apparatuses to automatically determine conditions at hierarchical boundaries of a hierarchical circuit design and to use the determined conditions in hierarchical optimization and verification are described here. Some embodiments are summarized in this section.

In one embodiment of the present invention, a hierarchical block is optimized and transformed during design synthesis using one or more lemmas at the boundary of the hierarchical block. For example, the lemmas are automatically generated to specify range information for input boundary nodes. The lemmas are also used for the equivalence checker to perform hierarchical equivalence checking. Equivalence of hierarchical blocks is individually checked, in view of the lemmas. Thus, based on the lemmas, optimizations across hierarchical boundaries can be performed, while the hierarchical structure of the design is preserved so that equivalence checking of hierarchical circuit designs can still be based on the equivalence of individual hierarchical blocks.

In one aspect of the present invention, a method to design a circuit, includes: automatically generating at least one lemma at one or more locations of a first design of the circuit; based on the at least one lemma, transforming the first design of the circuit into a second design of the circuit; and checking equivalence between the first and second designs of the circuit using the at least one lemma. In one example, the at least one lemma specifies range information for one or more signal lines (e.g., possible combinations of signal values in a plurality of signal lines, possible combinations of signal values in a signal line in a number of clock cycles which can be used to automatically infer a multi-cycle path). The one or more locations may include one of: signal lines of a bus; input/output (I/O) lines of a state machine; the fanout of a logic element; and, a common support point of a plurality of logic elements. In one example, generating the at least one lemma includes determining range information at the one or more locations of the first design of the circuit. In one example, the at least one lemma is proved to prove the equivalence between the first and second designs. In one example, transforming the first design includes: transforming a first portion of the first design into a first portion of the second design based on the at least one lemma; and, transforming a second portion of the first design into a second portion of the second design. In one example, checking equivalence between the first and second designs includes: proving the at least one lemma; and, checking equivalence between the first portion of the first design and the first portion of the second design according to the at least one lemma, which is based on range information at output boundaries of the second portion of the first design. In one example, the first design includes a partition of a plurality of portions; and transforming the first design of the circuit into the second design of the circuit maintains the partition of the plurality of portions.

In one aspect of the present invention, a method to design a circuit with a plurality of portions, includes: automatically generating at least one lemma at one or more boundaries of the plurality of portions of the circuit; individually transforming the plurality of portions of the circuit from a first design into a second design using the at least one lemma; and exporting the at least one lemma. In one example, the at least one lemma specifies range information at the one or more boundaries of the plurality of portions. In one example, the at least one lemma is exported into a format readable by a software program for equivalence checking which is capable of checking equivalence between the first design of the plurality of portions of the circuit and the second design of the plurality of portions of the circuit based on the at least one lemma. In one example, generating the at least one lemma includes: determining range information at an output boundary of the plurality of portions of the circuit; and propagating the range information to one or more input boundary of the plurality of portions of the circuit. In one example, the at least one lemma is exported into a file on a data processing system. In one example, the at least one lemma is exported from a first application process for use by a second application process (e.g., a process that uses the at least one lemma for equivalence checking).

In one aspect of the present invention, a method for circuit design, includes: individually transforming a plurality of portions of a first design of a circuit into a plurality of portions of a second design of the circuit respectively, where a first one of the plurality of portions of the first design is transformed into a first one of the plurality of portions of the second design based on a lemma; and checking equivalence between the first and second designs of the circuit through checking equivalence between each of the plurality of portions of the first design and a corresponding one of the plurality of the second design where equivalence between the first one of the plurality of portions of the first design and the second one of the plurality of portions of the second design is checked based at least on the lemma. In one example, the lemma specifies range information at one or more boundaries of the plurality of portions of the first design (e.g., on one or more input boundary nodes, or on one or more output boundary nodes which provide input to the first one of the plurality of portions of the first design). In one example, information specifying the lemma is imported from a file on a data processing system; in another example, the lemma is automatically generated from the first design of the circuit.

In one aspect of the present invention, a method of hierarchical circuit design, includes: automatically transforming a first one of a plurality of hierarchical blocks of a first hierarchical circuit design into a first block of a second hierarchical circuit design based on a lemma indicating range information at a hierarchical boundary of the plurality of hierarchical blocks of the first hierarchical circuit design. In one example, the lemma specifies at least one of: range information at input boundary nodes of the first one of the plurality of hierarchical blocks; and range information at output boundary nodes of at least one of the plurality of hierarchical blocks of the first hierarchical circuit design. The output boundary nodes provide input to the first one of the plurality of hierarchical blocks of the first hierarchical circuit design. In one example, the lemma is automatically generated.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

At least one embodiment of the present invention seeks to optimize a hierarchical circuit design across hierarchical boundaries and to perform equivalence checking based on the equivalence of individual hierarchical blocks. In one embodiment of the present invention, lemmas specifying range information for boundary nodes on the hierarchical boundaries are automatically determined; and both synthesis optimization and equivalence checking operations use the lemmas to operate on the hierarchical blocks individually. The range information at the output boundaries of the hierarchical blocks is determined and propagated to the input boundaries for optimization and equivalence checking. In one embodiment of the present invention, the lemmas generated and used by a synthesis tool are exported for use by an equivalence checking tool so that the optimization and equivalence checking are based on the same lemmas. In one embodiment of the present invention, the equivalence checking is based on proving the lemmas and proving the equivalence of individual blocks in view of the lemmas. Thus, the scope of automated optimization in logic synthesis can be expanded to across the hierarchical boundaries; and the equivalence checking can be still performed blockwisely.

Many of the methods of the present invention may be performed with a digital processing system, such as a conventional, general-purpose computer system. Special purpose computers, which are designed or programmed to perform only one function, may also be used.

Figure 1:
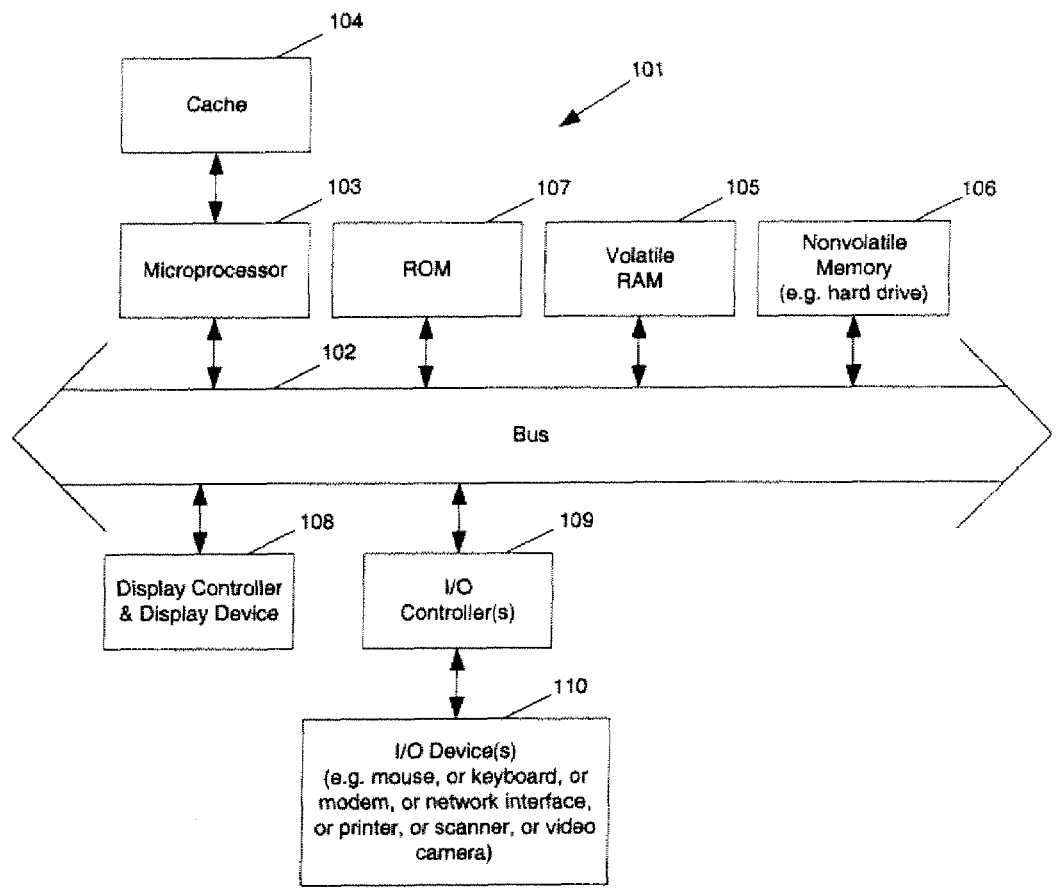
FIG. 1 shows a block diagram example of a data processing system which may be used with the present invention.

FIG. 1 shows one example of a typical computer system which may be used with the present invention. Note that while FIG. 1 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be a Sun workstation, or a personal computer (PC) running a Windows operating system, or an Apple Macintosh computer.

As shown in FIG. 1, the computer system 101, which is a form of a data processing system, includes a bus 102 which is coupled to a microprocessor 103 and a ROM 107 and volatile RAM 105 and a non-volatile memory 106. The microprocessor 103 is coupled to cache memory 104 as shown in the example of FIG. 1. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 1 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 1. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

Figure 2:
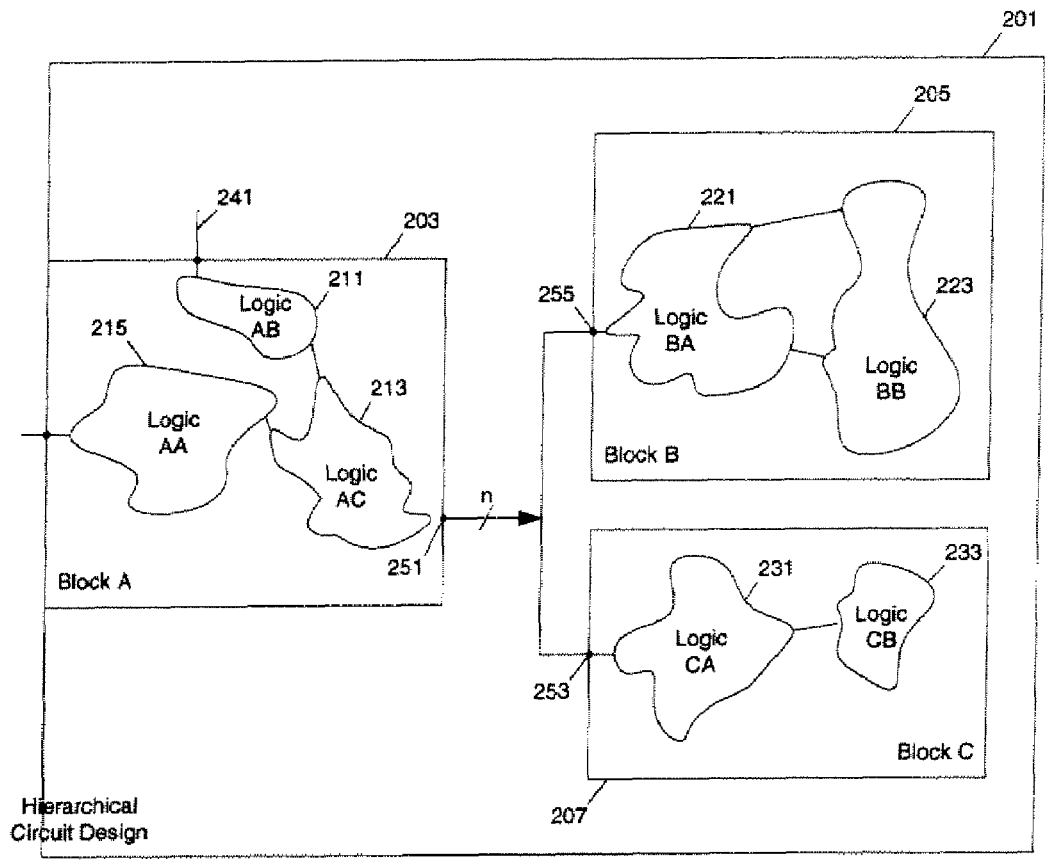
FIG. 2 shows a block diagram example of a hierarchical design of a circuit which can be optimized and verified according to methods of embodiments of the present invention.

FIG. 2 shows a block diagram example of a hierarchical design (201) of a circuit which can be optimized and verified according to methods of embodiments of the present invention. A hierarchical design (e.g., 201) includes a plurality of hierarchical blocks (e.g., blocks 203, 205 and 207). The hierarchical boundaries delimit the hierarchical blocks so that each of the hierarchical blocks can be considered independently from other hierarchical blocks. Each of the hierarchical blocks can have a number of logic elements. For example, hierarchical block 203 has logic elements 211-215; hierarchical block 205 has logic elements 221-223; and hierarchical block 207 has logic elements 231-233. During a logic synthesis process, the logic elements of a hierarchical block can be transformed, combined, eliminated or replicated to produce an equivalent circuit design.

Synthesis optimizations are typically performed to improve timing, to reduce the die area usage, to reduce power consumption, etc. Such transformations and optimizations are typically limited within each of the hierarchical blocks so that the mapping between the hierarchical blocks of the original design and the hierarchical blocks of the blocks of the resulting design is clear. Since no optimization across the hierarchical boundaries is performed, the original block and the corresponding transformed block are equivalent. Thus, equivalence checking can be performed through comparing the corresponding blocks. If each original hierarchical block and the corresponding transformed hierarchical block are equivalent, the original design and the resulting design are equivalent.

In one embodiment of the present invention, the range information for output boundaries of hierarchical blocks is propagated to the input boundaries of other hierarchical blocks so that the output range information for the hierarchical blocks can be used to optimize other hierarchical blocks. The propagation of the range information (or other constraint information) from one hierarchical block to another allows optimization to be effectively performed across the hierarchical boundaries of the hierarchical design. However, the hierarchical structure is still maintained. When the range information is used with the original design of a hierarchical block, formal verification can be performed for individual hierarchical blocks without false negatives. Thus, verification can still be performed using a hierarchical approach, based on the equivalence of individual hierarchical blocks.

For example, in FIG. 2, output boundary node 251 of hierarchical block 203 provides input signals to input boundary node 255 of hierarchical block 205 and input boundary node 253 of hierarchical block 207. After the output range information is evaluated at output boundary node 251, the range information can be propagated to the input boundary nodes 253 and 255. The range information at the input boundary nodes 253 and 255 can be specified as lemmas for the hierarchical blocks 205 and 207 respectively. A lemma specifies one or more conditions (e.g., range information). In one embodiment of the present invention, a software tool automatically determines the range information at output boundaries of hierarchical blocks and propagates the range information to the input boundaries of the hierarchical blocks. The range information at the input boundaries of the hierarchical blocks can be used for synthesis optimization of the hierarchical blocks and for equivalence checking of the hierarchical blocks. Since the synthesis transformation is performed individually for a hierarchical block under the condition of the input range information, there is equivalence between the original block and the corresponding transformed block under the condition of the input range information.

Alternatively, the output range information at output boundary node 251 can be specified as a lemma for the hierarchical block 203. A synthesis tool and an equivalence checking tool can then separately propagate the lemma to the input boundaries of the hierarchical blocks for the optimization and verification.

In one embodiment of the present invention, a lemma can be used to specify don't-care information at an output. The don't-care information can be propagated backwards to an input boundary to generate input range information which can be used for synthesis optimization of the hierarchical block and for the equivalence checking of the hierarchical block. For example, a multiplexer outputs according to a first input line when the selection signal is 1 and according to the second input line when the selection signal is 0. Thus, when the selection signal is 1, the multiplexer output does not care about the signals of the second input line; when the selection signal is 0, the multiplexer output does not care about the status of the signals of the first input line. A lemma can be used to specify such don't-care information. In one embodiment, the don't care information is propagated backwards to the input of a hierarchical boundary to generate range information, which can be used as the condition for synthesis optimization and equivalence checking. Further, don't-care information may be associated with clock cycles. For example, in a multi-cycle path, the output of a module on the path during an intermediate clock cycle may be don't care information. Such don't care information associated with clock cycle can be referred to as sequential don't-care information.

It is understood that a lemma does not have to specify the exact range information. The lemma specifies a constraint on the range (e.g., a range that includes the exact range). The exact range information specifies the minimum possible combinations of values that the upstream hierarchical blocks will generate. When no lemma is specified, the input boundary is assumed to have a full range so that any combination of values is considered as a possible input to the hierarchical block. A superset range information specifies a range that contains the exact range. It is understood that a superset range information is also an admissible constraint, which can be specified as a lemma according to embodiments of the present invention. Since a full range includes all values without a constraint, the assumption of a full range for a hierarchical boundary is not considered as a lemma. If the optimization for the hierarchical block and the verification for the block are both based on the same superset range information, equivalence checking will not generate false non-equivalence results.

In one embodiment of the present invention, an equivalence checking tool proves the lemmas and then, based on the lemmas, proves the equivalence of the corresponding hierarchical blocks. When the lemmas and the equivalence of the corresponding hierarchical blocks are proved, the equivalence between the original hierarchical design and the transformed hierarchical design is proved.

When proving a lemma, a software tool may use one or more other lemmas. The software tool may use only proved lemmas to prove a lemma. Alternatively, the software tool may prove a lemma based on one or more other lemmas that have not yet been proved. After all lemmas are proved based on one or more other lemmas, it can be concluded that the lemmas are all proved if there is no circular dependency in the process of proving one lemma depending on other lemmas.

Figure 3:
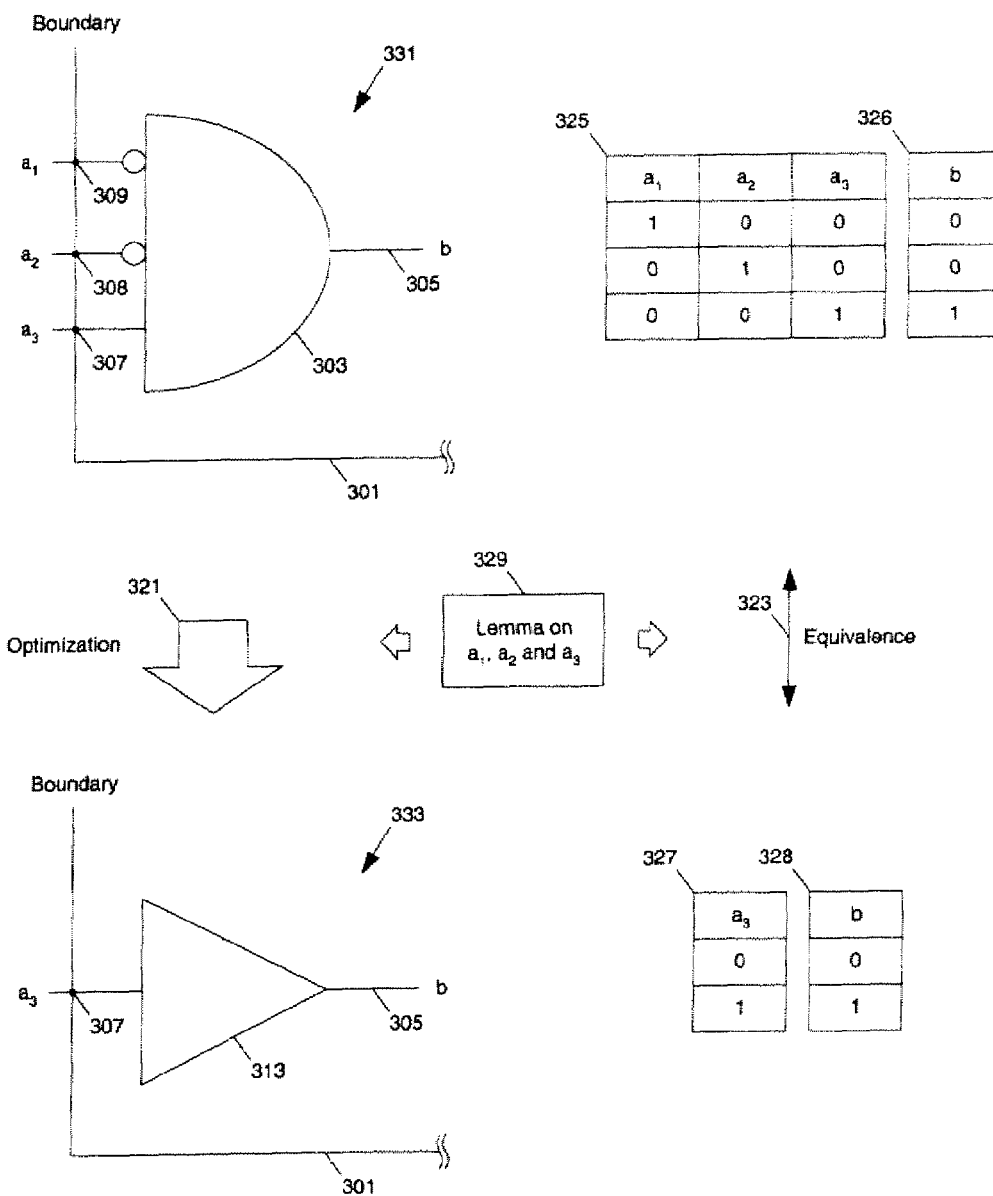
FIG. 3 illustrates an example of optimizing and verifying a hierarchical circuit design according to one embodiment of the present invention.

FIG. 3 illustrates an example of optimizing and verifying a hierarchical circuit design according to one embodiment of the present invention. In FIG. 3, hierarchical boundary 301 has input nodes $a_1$ (309), $a_2$ (308) and $a_3$ (307). The input signals for nodes $a_1$, $a_2$ and $a_3$ can be from one or more hierarchical blocks. When no specific information about the signals on nodes $a_1$, $a_2$ and $a_3$ are available, a transformation of the hierarchical block within the boundary 301 must be valid for all possible combinations of signals. Thus, optimizations that can be performed under certain conditions cannot be performed with the specific information about the signals on the input nodes. When a lemma (329) specifying the range information (e.g., 325) on nodes $a_1$, $a_2$ and $a_3$ is available, a synthesis tool can perform optimizations that would not be allowed if the full range were assumed.

For example, when the signal nodes $a_1$, $a_2$ and $a_3$ have the range shown in table 325, the output values of logic 303 are shown in the corresponding rows of table 326. Thus, when the range information in table 325 is specified in a lemma for input nodes $a_1$, $a_2$ and $a_3$, a synthesis tool can perform an optimization (321) which substitutes logic element 303 with logic element 313. Tables 327 and 328 show the mapping between the input signal at node $a_3$ (307) and the output signal on line 305. Since the lemma (329) specifies the range information (325), an equivalence checking tool can automatically determine that there is equivalence (323) between the original design and the optimized design.

In FIG. 3, it is seen that there would be no equivalence between design 331 and design 333 if there were no constraints on the input values at nodes $a_1$, $a_2$, and $a_3$. After lemma 329 specifies a constraint on the input values for the hierarchical block, according to the output values of other hierarchical block(s), the optimization can be performed under the condition specified by lemma 329. Since the constraint specified by lemma 329 is based on the output of other hierarchical blocks, optimizations are performed effectively across the hierarchical boundaries. However, the hierarchical structure for the formal verification process is still preserved. In the hierarchical verification process, the equivalence checking is based on the equivalence of hierarchical blocks. The equivalence of two hierarchical designs is provided through proving the equivalence of corresponding hierarchical blocks. In a traditional approach, optimizations across the hierarchical boundaries cause non-equivalence in corresponding hierarchical blocks in a formal hierarchical verification process, which leads to a false result of non-equivalence. According to one embodiment of the present invention, the lemma is generated and used by both the synthesis tool and the verification tool so that the synthesis tool will not generate non-equivalence in the corresponding hierarchical blocks if the optimization is correctly performed.

In general, a lemma at an output boundary specifies certain conditions about the output values of the hierarchical block; and a lemma at an input boundary specifies certain conditions about the input values of the hierarchical block. The lemma may specify the values of a set of signal lines of a bus, or input/output (I/O) lines of a state machine, or fanout of a logic element, or a common support point of a plurality of logic elements, or peripheral I/O ports, or collection of hierarchical ports, or collection of a set of related signals. Alternatively, a lemma may specify the range information for the entire input or output boundary of a hierarchical block. For example, the lemma may be in the form of a table showing an admissible state space for the boundary nodes for any clock cycle or for a number of consecutive clock cycles. For example, a constant on an input line (or an output line) of a hierarchical block can be specified in a lemma. For example, a lemma may specify that the state of a signal line is always zero in even-numbered clock cycles.

In the example of FIG. 3, the range information specifies the possible combinations of values on a number of signal lines. It is understood that the range information may also specify the possible combinations of values on one signal line in different clock cycles. For example, the possible sequences of values on a signal line during a given number of clock cycles can also be used as range information in a lemma. Further, combinations of different types of range information (e.g., across signal lines, or across clock cycles) can also be used.

Figure 4:
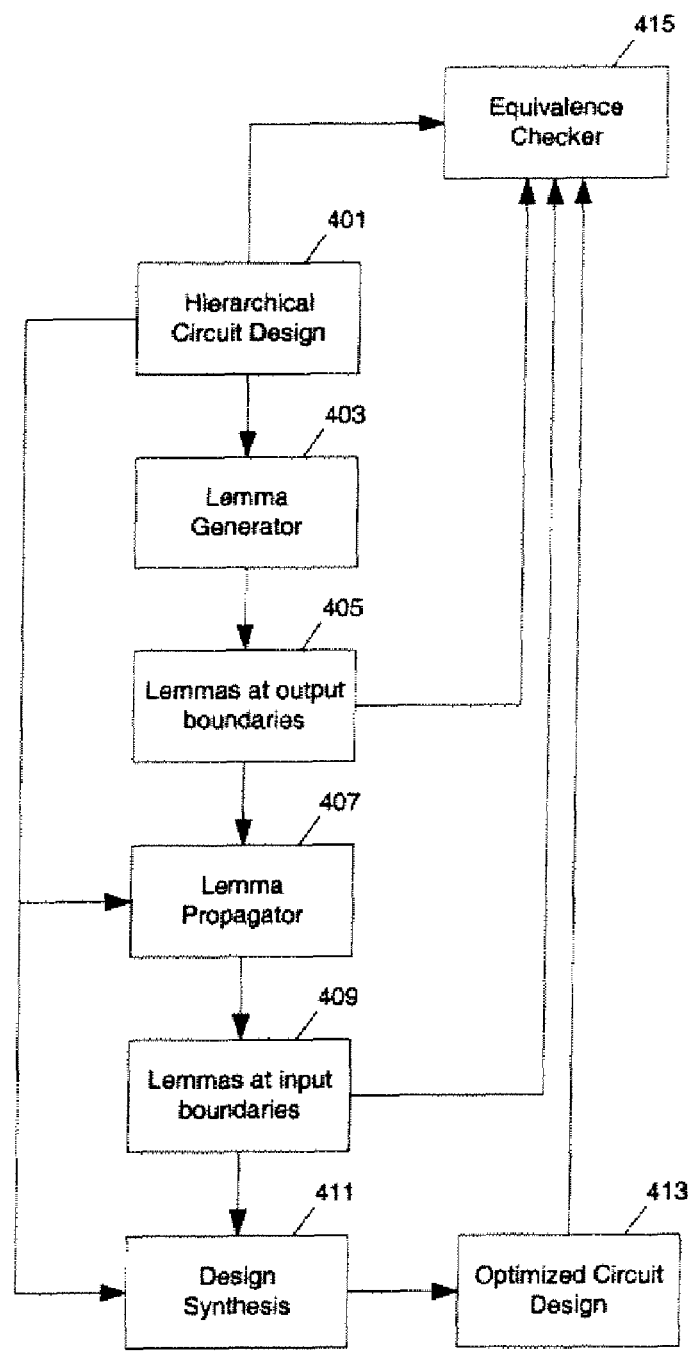
FIG. 4 illustrates a diagram of design flow according to one embodiment of the present invention.

FIG. 4 illustrates a diagram of design flow according to one embodiment of the present invention. A hierarchical design (401) is typically provided in a Hardware Description Language (HDL). A lemma generator (403) is typically a software tool (e.g. a separate, stand along application) or a software module (e.g., a program routine of an application program). The lemma generator automatically determines conditions (e.g., range information) at the output boundaries of hierarchical blocks based on the hierarchical design (401). The lemma generator (403) generates lemmas (405) at output boundaries of hierarchical blocks of the hierarchical design (401).

A lemma propagator (407) can also be a software tool (e.g., a separate, stand along application) or a software module (e.g., a program routine of an application program). The lemma propagator (407) propagates the lemmas (405) at the output boundaries of hierarchical blocks of the hierarchical design to the corresponding input boundaries of the hierarchical blocks. Propagating the lemma may include mapping the lemmas to an input boundary from an output boundary (e.g., when the signal is transmitted from the input boundary to the output boundary without any change), combining lemmas (e.g., when signals of two or more output nodes of two or more hierarchical blocks are combined as an input to the input boundary), or converting a lemma (e.g., when a state machine converts the output signal into corresponding input signals). The lemmas (409) at the input boundaries can be used by design synthesis (411) to perform optimization and synthesis transformation.

Note that the propagation of the lemmas from the output boundary to the input boundary does not have to be exact, since a superset of range information is acceptable in the place of an exact range, although the difference between the exact range and the superset of range may prevent certain admissible optimizations that are based on the exact range. A superset can be used to reduce the complexity of the range. For example, when the exact range is too complex for computation run time, memory usage, etc., a superset can be used.

A design synthesis software tool may contain the lemma generator, lemma propagator and design synthesis as different modules. Alternatively, a lemma generator and a lemma propagator may be provided as a separate software program which exports the lemmas for the design synthesis software tool and the equivalence checker (415).

The design synthesis (411) generates the optimized circuit design (413) based on lemmas (409) at the input boundaries and the original hierarchical circuit design (401). Each hierarchical block is individually optimized and transformed in view of the lemmas for the corresponding block.

An equivalence checker (415) is typically a software tool separate from the design synthesis (411), although a design synthesis (411) may also have an equivalence checker as a module.

In one embodiment of the present invention, both the design synthesis (411) and the equivalence checker (415) use the same lemmas (409) at output boundaries. After the equivalence checker proves the lemma at the input boundaries (409), the equivalence checker proves the equivalence of the individual hierarchical blocks, in view of the lemmas (409), to prove the equivalence between the original design and the optimized design. In one embodiment of the present invention, the equivalence checker further proves the lemmas (405) at output boundaries; and based on the lemmas (405) at output boundaries of the hierarchical blocks, the equivalence checker then proves the lemmas (409) at input boundaries of the hierarchical blocks.

Alternatively, the lemmas may be propagated separated for the transformation and for the verification. For example, in one embodiment, the lemmas are generated only at the output boundary. The design synthesis and equivalence checker propagate the lemmas separately for optimization and for verification (e.g., through separately propagating the exactly range information according to the hierarchical design). False non-equivalence results may be generated if the equivalence checker generates a range that is larger than the range used by the design synthesis. However, if the equivalence check always propagates the range information exactly, there will be no false non-equivalence results even if the design synthesis generates the optimization using different range information (e.g., the superset of the exact propagation). In general, there will be no false non-equivalence result if the range used by the equivalence check is a subset of the range used by the design synthesis.

In one embodiment of the present invention, a design synthesis software tool exports the lemmas (e.g., the range information for the input boundary) that are used in optimizing the individual hierarchical blocks so that the equivalence checker can use the same lemma during the verification process in checking the block equivalence. One software application process typically exports information for another application process (e.g., a different run of the program or a run of a different program) through a file of a file system on a data processing system, or rough a database, or through a network connection, or other communication methods. For example, the lemma can be exported into a file in a format readable by the equivalence checker. Alternatively, the design synthesis and equivalence may be both running and communicating with each other through a communication link (e.g., a network connection, or an inter-process communication protocol).

Figure 5:
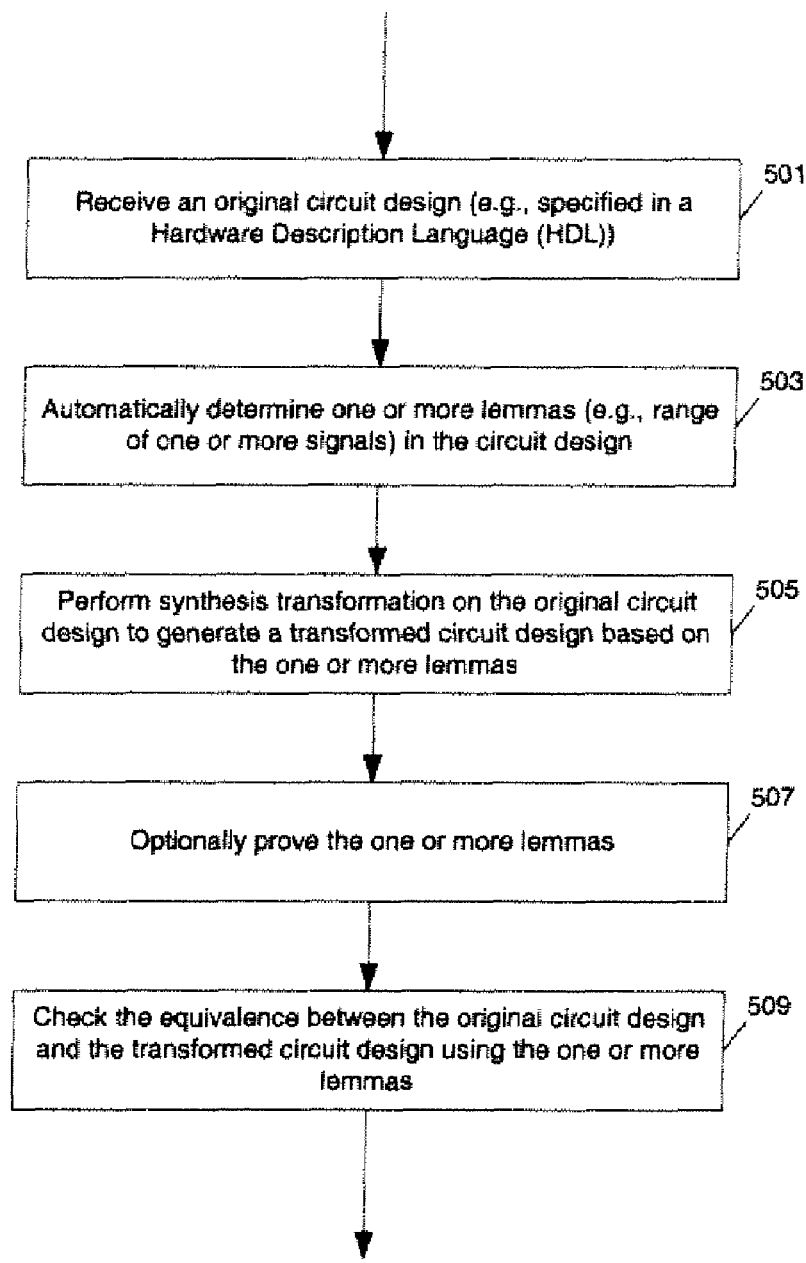
FIG. 5 shows a flow chart of a method for the optimization and verification of circuit designs according to one embodiment of the present invention.

FIG. 5 shows a flow chart of a method for the optimization and verification of circuit designs according to one embodiment of the present invention. After operation 501 receives an original circuit design (e.g., specified in a Hardware Description Language (HDL)), operation 503 automatically determines one or more lemmas (e.g., range of one or more signals) in the circuit design. Operation 505 performs synthesis transformation on the original circuit design to generate a transformed circuit design based on the one or more lemmas. Operation 507 optionally proves the one or more lemmas. Operation 509 checks the equivalence between the original circuit design and the transformed circuit design using the one or more lemmas. Thus, the one or more lemmas are used both in synthesis transformation and in equivalence checking.

Figure 6:
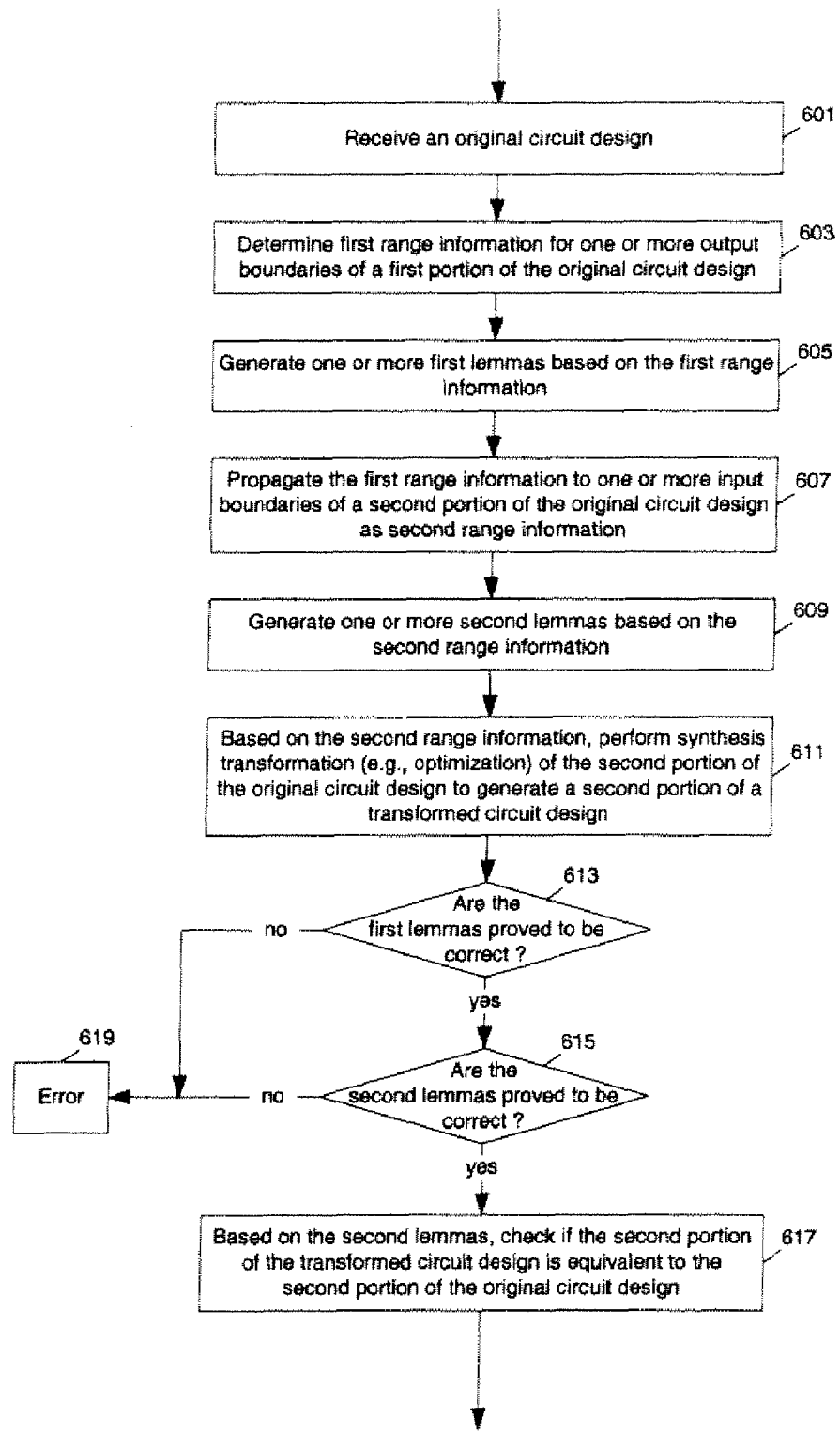
FIG. 6 shows a detailed flow chart of a method for the optimization and verification of hierarchical circuit designs according to one embodiment of the present invention.

FIG. 6 shows a detailed flow chart of a method for the optimization and verification of hierarchical circuit designs according to one embodiment of the present invention. After operation 601 receives an original circuit design, operation 603 determines first range information for one or more output boundaries of a first portion of the original circuit design. Operation 605 generates one or more first lemmas based on the first range information. After operation 607 propagates the first range information to one or more input boundaries of a second portion of the original circuit design as second range information, operation 609 generates one or more second lemmas based on the second range information. Based on the second range information, operation 611 performs synthesis transformation (e.g., optimization) of the second portion of the original circuit design to generate a second portion of a transformed circuit design. If operations 613 and 615 determine the first and second lemmas are proved to be correct, operation 617 checks if the second portion of the transformed circuit design is equivalent to the second portion of the original circuit design based on the second lemmas; otherwise, it can be determined that there is an error (619) and there is no equivalence between the original and transformed design.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory machine readable storage medium containing executable computer program instructions which when executed by a digital processing system cause said system to perform a method to design a circuit with a plurality of portions, the method comprising:
   automatically generating, by a processor, at least one lemma that specifies one or more conditions across one or more boundaries of the plurality of portions of the circuit;
   individually transforming the plurality of portions of the circuit from a first design into a second design using the at least one lemma; and
   exporting the at least one lemma for use by one or more application processes.

2. The medium of claim 1, wherein the at least one lemma specifies range information at the one or more boundaries of the plurality of portions.

3. The medium of claim 1, wherein the at least one lemma is exported into a format readable by a software program for equivalence checking which is capable of checking equivalence between the first design of the plurality of portions of the circuit and the second design of the plurality of portions of the circuit based on the at least one lemma.

4. The medium of claim 1, wherein said generating the at least one lemma comprises:
   determining range information at an output boundary of the plurality of portions of the circuit; and
   propagating the range information to one or more input boundary of the plurality of portions of the circuit.

5. The medium of claim 1, wherein the at least one lemma is exported into a file on a data processing system.

6. The medium of claim 1, wherein the at least one lemma is exported from a first application process for use by a second application process; and the second application process uses the at least one lemma for equivalence checking.

7. A method to design a circuit with a plurality of portions, the method comprising:
   automatically generating, by a processor, at least one lemma that specifies one or more conditions across one or more boundaries of the plurality of portions of the circuit;
   individually transforming the plurality of portions of the circuit from a first design into a second design using the at least one lemma; and
   exporting the at least one lemma for use by one or more application processes.

8. The method of claim 7, wherein the at least one lemma specifies range information or don't care information at the one or more boundaries of the plurality of portions.

9. The method of claim 7, wherein the at least one lemma is exported into a format readable by a software program for equivalence checking which is capable of checking equivalence between the first design of the plurality of portions of the circuit and the second design of the plurality of portions of the circuit based on the at least one lemma.

10. The method of claim 7, wherein said generating the at least one lemma comprises:
    determining range information at an output boundary of the plurality of portions of the circuit; and
    propagating the range information to one or more input boundary of the plurality of portions of the circuit.

11. The method of claim 7, wherein the at least one lemma is exported into a file on a data processing system.

12. The method of claim 7, wherein the at least one lemma is exported from a first application process for use by a second application process; and the second application process uses the at least one lemma for equivalence checking.

13. A data processing system to design a circuit with a plurality of portions, the data processing system comprising:
    means for automatically generating at least one lemma that specifies one or more conditions across one or more boundaries of the plurality of portions of the circuit;
    means for individually transforming the plurality of portions of the circuit from a first design into a second design using the at least one lemma; and
    means for exporting the at least one lemma for use by one or more application processes, wherein at least one of the means for automatically generating, means for individually transforming, and means for exporting includes a processor.

14. The data processing system of claim 13, wherein the at least one lemma is exported from a first application process for use by a second application process.

15. A data processing system of hierarchical circuit design, the data processing system comprising:

means for automatically transforming a first one of a plurality of hierarchical blocks of a first hierarchical circuit design into a first block of a second hierarchical circuit design based on a lemma indicating range information across a hierarchical boundary of the plurality of hierarchical blocks of the first hierarchical circuit design, wherein the means for automatically transforming includes a processor.

16. The data processing system of claim 15, further comprising:
means for automatically generating the lemma.

17. A data processing system, comprising:
a processor, and
a memory coupled to the processor, wherein the processor is configured to automatically generate at least one lemma that specifies one or more conditions across one or more boundaries of the plurality of portions of the circuit, the processor is configured to individually transforming the plurality of portions of the circuit from a first design into a second design using the at least one lemma; and the processor is configured to export the at least one lemma for use by one or more application processes.

18. The data processing system of claim 17, wherein the at least one lemma specifies range information or don't-care information at the one or more boundaries of the plurality of portions.

19. The data processing system of claim 17, wherein the at least one lemma is exported into a format readable by a software program for equivalence checking which is capable of checking equivalence between the first design of the plurality of portions of the circuit and the second design of the plurality of portions of the circuit based on the at least one lemma.

20. The data processing system of claim 17, wherein the processor is further configured to determine range information at an output boundary of the plurality of portions of the circuit; and the processor is configured to propagate the range information to one or more input boundary of the plurality of portions of the circuit.

21. The data processing system of claim 17, wherein the at least one lemma is exported from a first application process for use by a second application process; and the second application process uses the at least one lemma for equivalence checking.

22. The data processing system of claim 17, wherein the at least one lemma is exported into a file on a data processing system.

* * * * *